(12) United States Patent
Haga

(10) Patent No.: US 10,340,208 B2
(45) Date of Patent: Jul. 2, 2019

(54) SEMICONDUCTOR DEVICE

(71) Applicant: ROHM CO., LTD., Kyoto-shi, Kyoto (JP)

(72) Inventor: Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/867,083

(22) Filed: Jan. 10, 2018

(65) Prior Publication Data
US 2018/0197807 A1    Jul. 12, 2018

(30) Foreign Application Priority Data
Jan. 12, 2017   (JP) ................................. 2017-003331

(51) Int. Cl.
H01L 21/48       (2006.01)
H01L 23/31       (2006.01)
H01L 23/495      (2006.01)

(52) U.S. Cl.
CPC .... *H01L 23/49513* (2013.01); *H01L 21/4842* (2013.01); *H01L 23/3114* (2013.01); *H01L 23/4952* (2013.01); *H01L 23/49548* (2013.01); *H01L 23/49562* (2013.01); *H01L 23/49541* (2013.01); *H01L 2224/02125* (2013.01); *H01L 2224/02135* (2013.01); *H01L 2224/02165* (2013.01); *H01L 2224/02175* (2013.01); *H01L 2224/02235* (2013.01); *H01L 2224/02245* (2013.01); *H01L 2224/0603* (2013.01); *H01L 2224/32245* (2013.01); *H01L 2224/45014* (2013.01); *H01L 2224/48247* (2013.01); *H01L 2224/48472* (2013.01); *H01L 2224/4903* (2013.01); *H01L 2224/73265* (2013.01);

(Continued)

(58) Field of Classification Search
CPC ......... H01L 23/49541; H01L 23/49548; H01L 21/4892; H01L 2224/02135; H01L 2224/02175; H01L 2224/02245; H01L 2224/02125; H01L 2224/02167; H01L 2224/02235

See application file for complete search history.

(56) References Cited

U.S. PATENT DOCUMENTS 4,994,897 A * 2/1991 Golubic ............. H01L 23/4334
                                                            257/667
5,733,799 A * 3/1998 Teruyama ........... H01L 21/4842
                                                            257/E21.504

(Continued)

FOREIGN PATENT DOCUMENTS

JP             11-297729 A         10/1999

*Primary Examiner* — David A Zerneke
(74) *Attorney, Agent, or Firm* — Hamre, Schumann, Mueller & Larson, P.C.

(57) ABSTRACT

A semiconductor device includes a semiconductor element, a lead on which the semiconductor element is mounted, a bonding member fixing the semiconductor element to the lead, and a resin package enclosing the semiconductor element and a portion of the lead. This lead is formed with a groove recessed at a location spaced from the semiconductor element. The groove has first and second inner surfaces, where the first inner surface is closer to the semiconductor element than is the second inner surface. The angle the first inner surface forms with respect to the thickness direction of the semiconductor element is smaller than the angle the second inner surface forms with respect to the thickness direction.

28 Claims, 11 Drawing Sheets

(52) U.S. Cl.
CPC ............... *H01L 2924/00014* (2013.01); *H01L 2924/181* (2013.01); *H01L 2924/18301* (2013.01)

(56) References Cited

U.S. PATENT DOCUMENTS

| | | | | |
|---|---|---|---|---|
| 6,388,311 | B1* | 5/2002 | Nakashima | H01L 23/49503 257/666 |
| 6,437,427 | B1* | 8/2002 | Choi | H01L 23/49503 257/666 |
| 6,700,189 | B2* | 3/2004 | Shibata | H01L 23/3107 257/666 |
| 6,713,849 | B2* | 3/2004 | Hasebe | H01L 23/3107 257/667 |
| 7,262,491 | B2* | 8/2007 | Islam | H01L 21/561 257/670 |
| 7,319,266 | B2* | 1/2008 | St. Germain | H01L 23/3107 257/676 |
| 7,911,054 | B2* | 3/2011 | Hasebe | H01L 23/3107 257/730 |
| 8,178,955 | B2* | 5/2012 | Itou | H01L 21/4828 257/663 |
| 8,237,250 | B2* | 8/2012 | Chang Chien | H01L 21/4832 257/669 |
| 9,337,129 | B2* | 5/2016 | Yasunaga | H01L 23/49555 |
| 9,443,816 | B2* | 9/2016 | Koga | H01L 24/48 |
| 9,620,438 | B2* | 4/2017 | Duca | H01L 23/4334 |
| 9,666,501 | B2* | 5/2017 | Haga | H01L 23/3121 |
| 10,104,775 | B2* | 10/2018 | Yoshimatsu | H05K 3/284 |
| 2002/0048853 | A1* | 4/2002 | Mastboom | H01L 21/4842 438/124 |
| 2004/0262781 | A1* | 12/2004 | Germain | H01L 23/3107 257/787 |
| 2005/0260795 | A1* | 11/2005 | Park | H01L 23/49503 438/111 |
| 2009/0039486 | A1* | 2/2009 | Shimazaki | H01L 21/561 257/676 |
| 2009/0152696 | A1* | 6/2009 | Dimasacat | H01L 23/49503 257/676 |
| 2009/0294932 | A1* | 12/2009 | Sahasrabudhe | H01L 23/49503 257/666 |
| 2010/0270571 | A1* | 10/2010 | Seo | H01L 33/486 257/98 |
| 2012/0018896 | A1* | 1/2012 | Koga | H01L 23/3107 257/773 |
| 2012/0217616 | A1* | 8/2012 | Matsuoka | H01L 23/49503 257/532 |
| 2013/0187188 | A1* | 7/2013 | Sasaoka | H05K 1/0313 174/255 |
| 2014/0191380 | A1* | 7/2014 | Lee | H01L 24/97 257/676 |
| 2014/0284783 | A1* | 9/2014 | Sayama | H01L 23/34 257/690 |
| 2014/0284784 | A1* | 9/2014 | Yasunaga | H01L 23/4952 257/690 |
| 2017/0110389 | A1* | 4/2017 | Hayashi | H01L 23/3114 |

* cited by examiner

SEMICONDUCTOR DEVICE

FIELD

The present disclosure relates to semiconductor devices.

BACKGROUND

Semiconductor devices with functional elements (such as diodes and transistors) enclosed with a resin package are known. JP-A-H11-297729, for example, discloses a resin-packaged semiconductor device including a number of leads and a semiconductor element mounted on one of the leads, typically a main lead.

With a conventional semiconductor device of the above type, use may be made of a bonding material to attach the semiconductor element to the main lead. The bonding material may be initially in a liquid state and solidified later to fix the semiconductor element to the lead. During the manufacturing process, however, the applied bonding material when in a liquid state may spread beyond the intended area on the main lead, hindering the proper flow of the production. Also, the overflown bonding material may cause a malfunction of the semiconductor device in use.

SUMMARY

The present disclosure is presented in view of the above circumstances for proposing a semiconductor device capable of restricting the undesired spreading of an applied bonding material.

According to an aspect of the disclosure, there is provided a semiconductor device including: a semiconductor element; a first lead having a first obverse surface on which the semiconductor element is mounted and a first reverse surface opposite to the first obverse surface; a bonding member that bonds the semiconductor element to the first obverse surface; and a resin package that encloses the semiconductor element and at least a portion of the first lead. In an embodiment, the first lead is formed with a first groove recessed in the first obverse surface at a location spaced apart from the semiconductor element as viewed in a thickness direction of the semiconductor element. The first groove has a first inner surface and a second inner surface opposite to the first inner surface, where the first inner surface is closer to the semiconductor element than is the second inner surface. The angle the first inner surface forms with respect to the thickness direction is smaller than the angle the second inner surface forms with respect to the thickness direction.

Other features and advantages of the present disclosure will be more apparent from the following description given with reference to the accompanying drawings.

DESCRIPTION OF THE PREFERRED EMBODIMENTS

Figure 1:
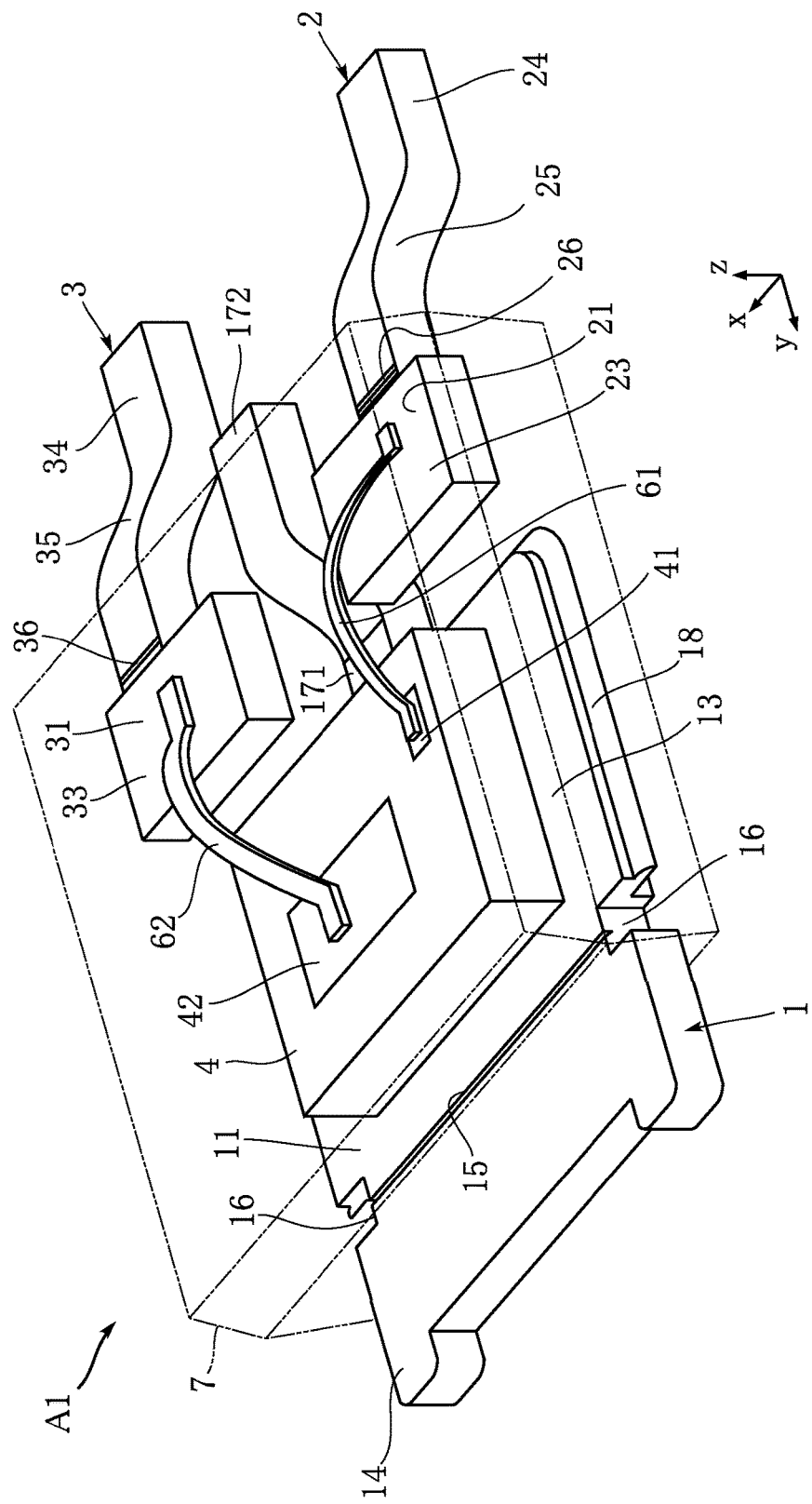
FIG. 1 is a perspective view of a semiconductor device according to a first embodiment of the present disclosure.

The following describes embodiments of the present disclosure with reference to the accompanying drawings.

FIGS. 1 to 10 show a semiconductor device A1 according to a first embodiment of the present disclosure. The semiconductor device A1 includes a first lead 1, a second lead 2, a third lead 3, a semiconductor element 4, a bonding member 5, wires 61 and 62 and a resin package 7.

Figure 2:
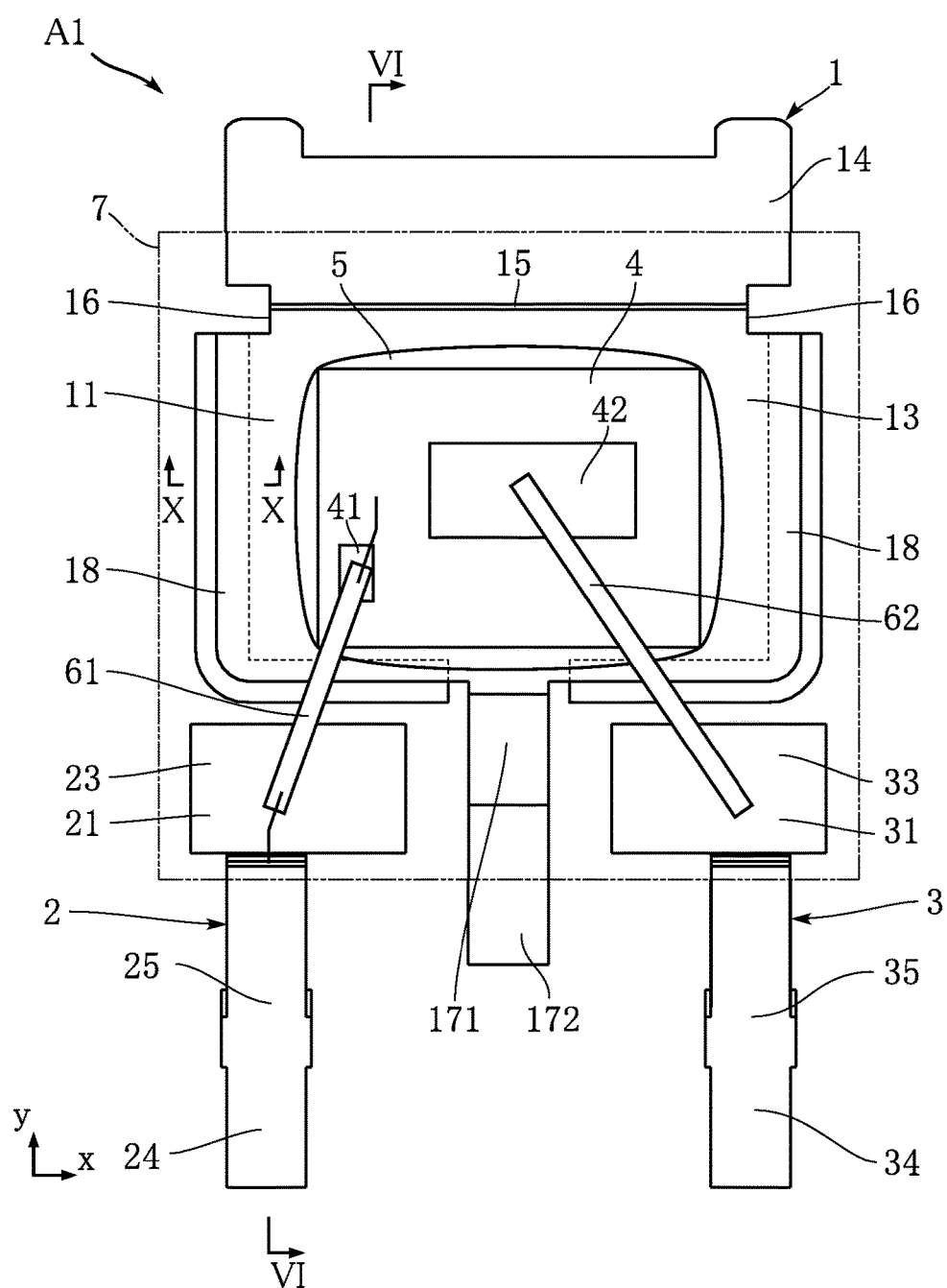
FIG. 2 is a top plan view of the semiconductor device shown in FIG. 1.
Figure 3:
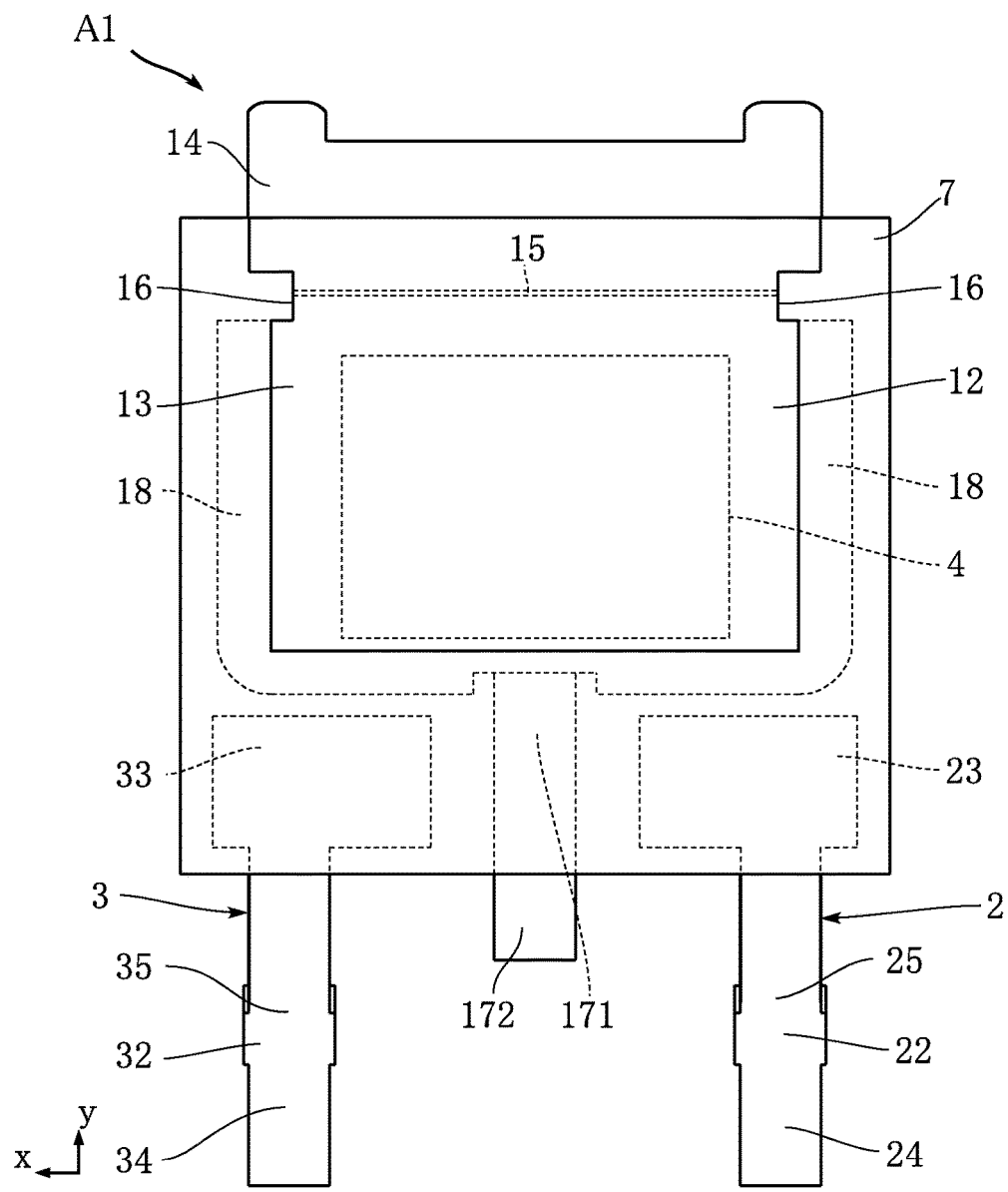
FIG. 3 is a bottom plan view of the semiconductor device shown in FIG. 1.
Figure 4:
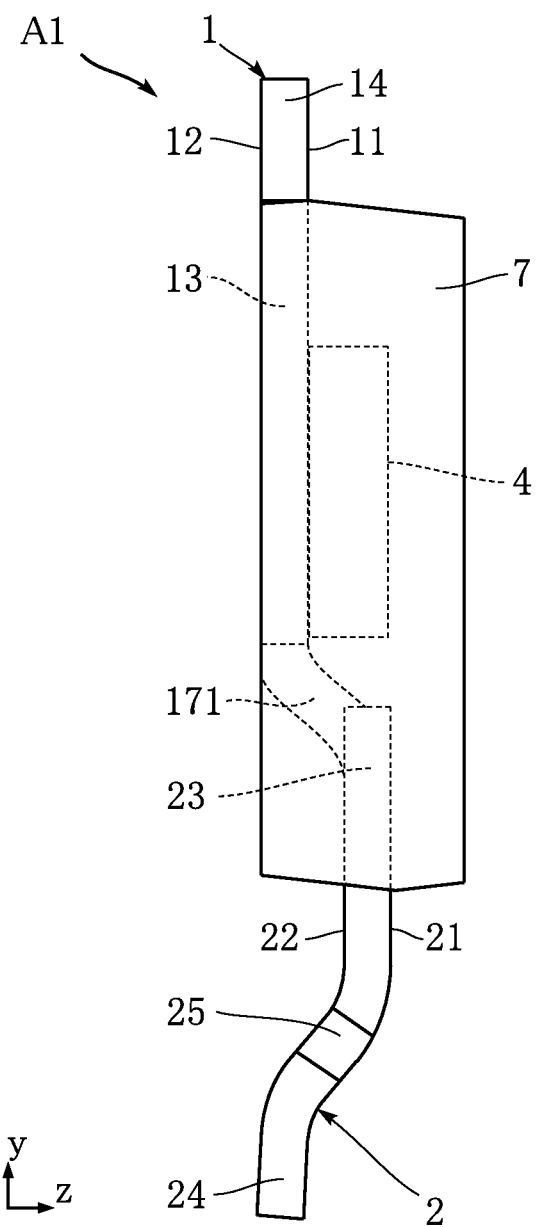
FIG. 4 is a side view of the semiconductor device shown in FIG. 1.
Figure 5:
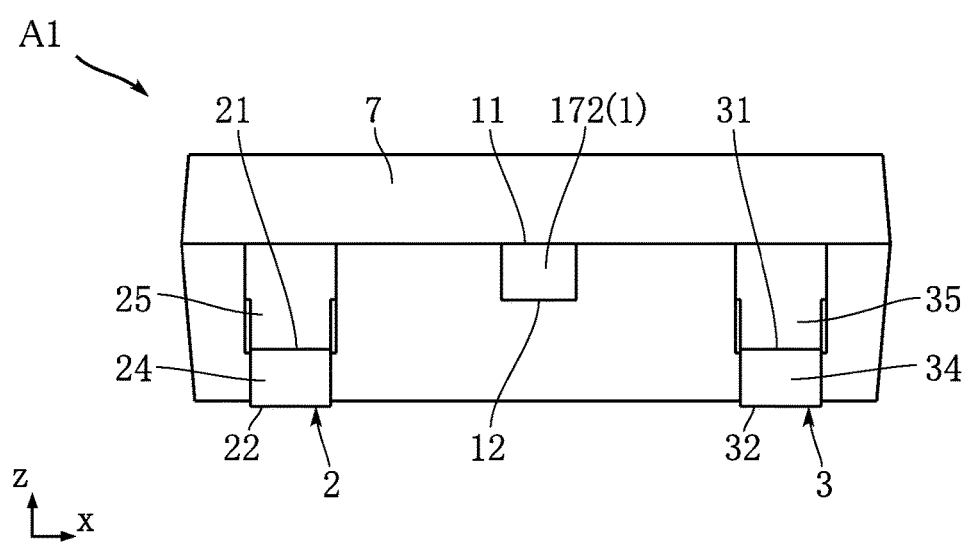
FIG. 5 is a front view of the semiconductor device shown in FIG. 1.
Figure 6:
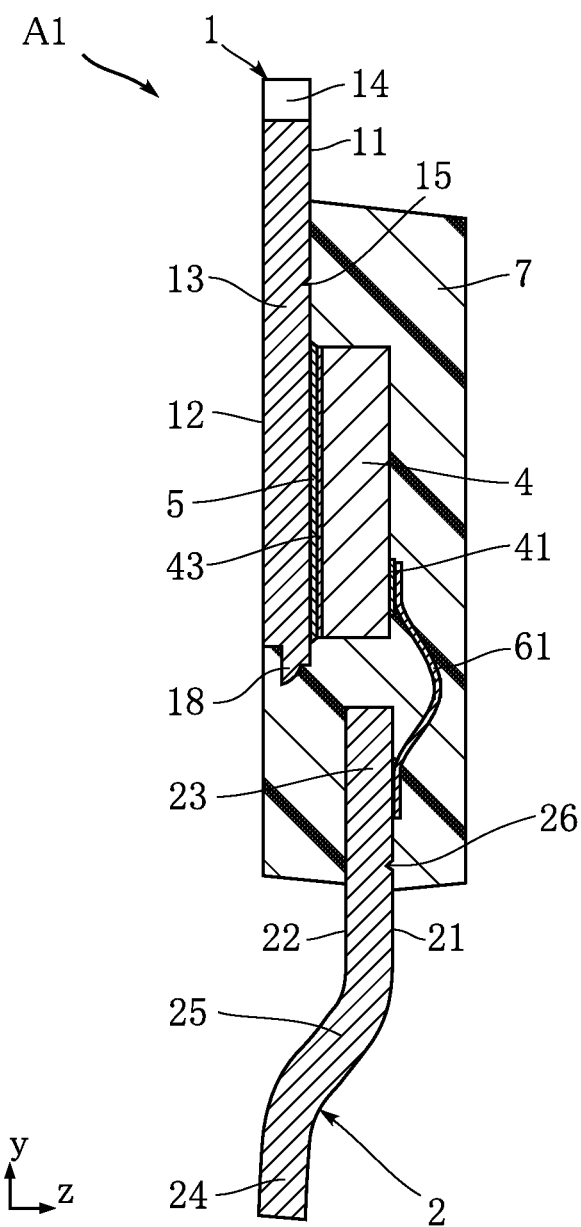
FIG. 6 is a sectional view taken along line VI-VI of FIG. 2.
Figure 7:
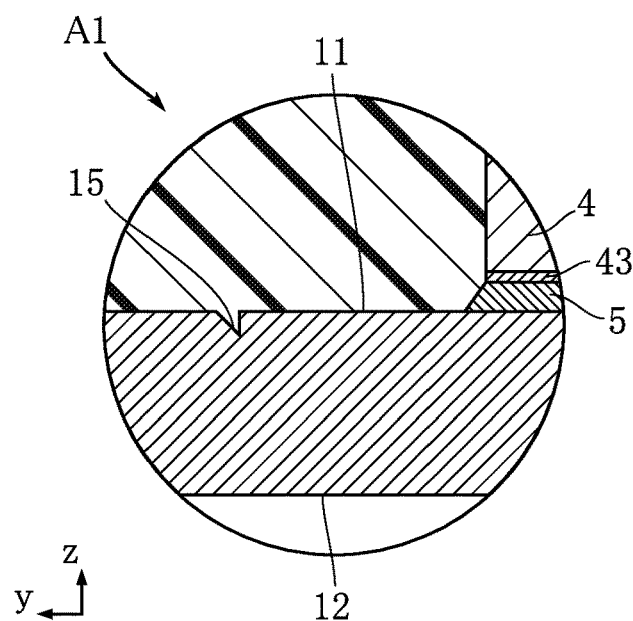
FIG. 7 is an enlarged sectional view taken along line VI-VI of FIG. 2.
Figure 8:
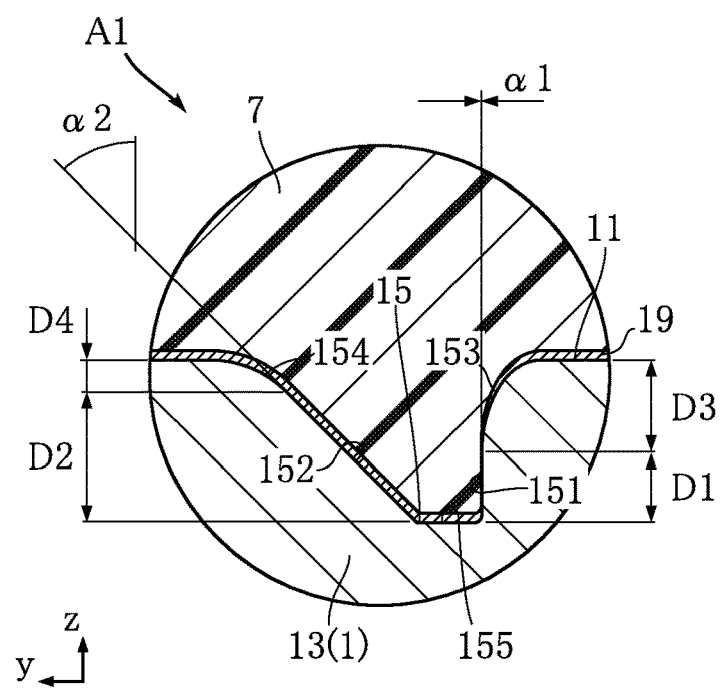
FIG. 8 is an enlarged sectional view taken along line VI-VI of FIG. 2.
Figure 9:
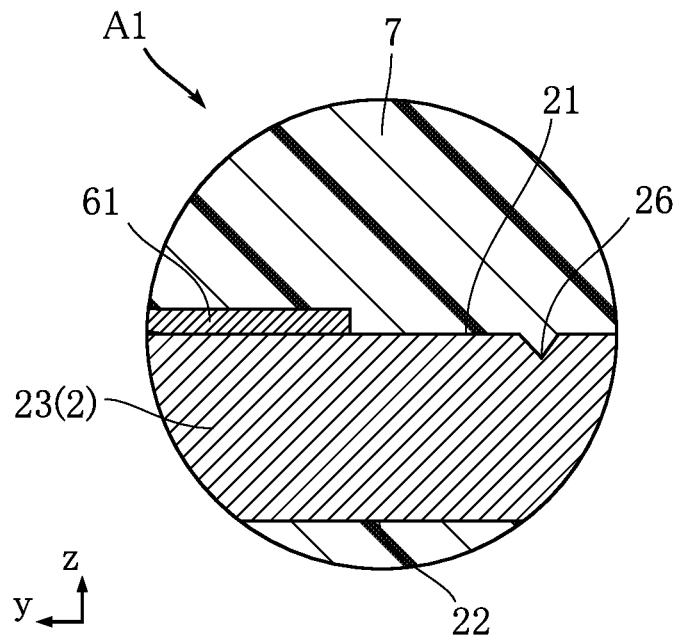
FIG. 9 is an enlarged sectional view taken along line VI-VI of FIG. 2.
Figure 10:
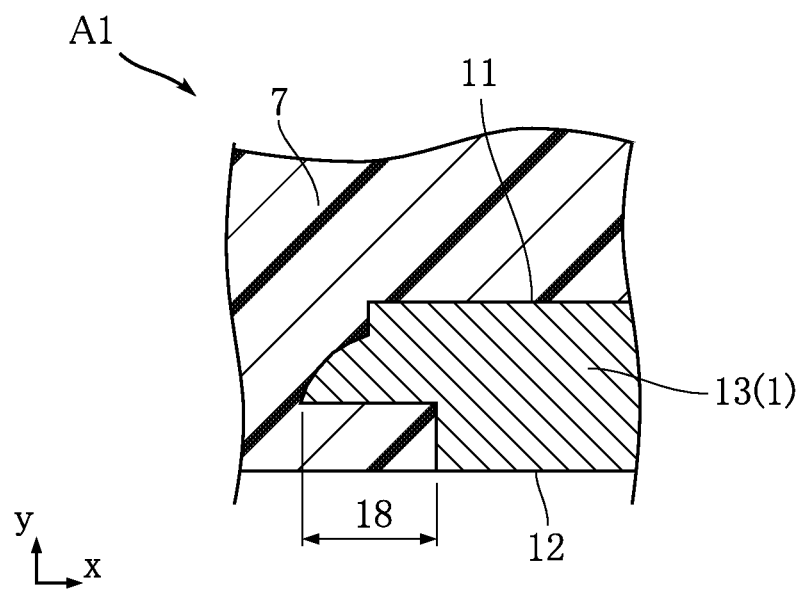
FIG. 10 is an enlarged sectional view taken along line X-X of FIG. 2.

FIG. 1 is a perspective view of the semiconductor device A1. FIG. 2 is a plan view of the semiconductor device A1. FIG. 3 is a bottom view of the semiconductor device A1. FIG. 4 is a side view of the semiconductor device A1. FIG. 5 is a front view of the semiconductor device A1. FIG. 6 is a sectional view taken along line VI-VI of FIG. 2. FIGS. 7 to 9 are each an enlarged sectional view taken along line VI-VI of FIG. 2. FIG. 10 is an enlarged sectional view taken along line X-X of FIG. 2. In the figures, the z direction corresponds to a thickness direction of the present disclosure, and the x and y direct ions are orthogonal to the z direction. For convenience of understanding, FIGS. 1 and 2 show the resin package 7 with phantom lines. Hereinafter, the x direction may be referred to as the "widthwise" direction, and the y direction as the "lengthwise" direction.

The shape and dimensions of the semiconductor device A1 are not specifically limited. For instance, the semiconductor device A1 may measure 5.0 to 8.0 mm in the x direction, 5.0 to 10.0 mm in the y direction (excluding the second and third leads 2, 3) and 2.0 to 4.0 mm in the z direction. In the example shown in the figures, the semiconductor device A1 has an x-direction dimension of 6.6 mm, a y-direction dimension of 7.2 mm and a z-direction dimension of 2.3 mm.

The first lead 1, the second lead 2 and the third lead 3 are pieces that are appropriately cut out of a metal lead frame patterned by, for example, stamping or etching. The first lead 1, the second lead 2 and the third lead 3 may be made of Cu or a Cu alloy, for example, although the material is not specifically limited. In the present embodiment, the first lead 1, the second lead 2 and the third lead 3 have the same maximum thickness as they are obtained from the same lead frame. The maximum thickness of the first lead 1 (hence the second lead 2 and the third lead 3 as well) may be from 0.4 to 1.0 mm. In an example, the maximum thickness is 0.5 mm. However, the maximum thickness of the leads is not specifically limited.

One or more of the first, second and third leads 1-3 may be provided with a plating layer made of a suitable material such as Ni. In the illustrated example (see FIG. 8), the first lead 1 is provided with a plating layer 19 formed thereon.

As shown in FIGS. 1 to 6, the first lead 1 has a first obverse surface 11, a first reverse surface 12, an island portion 13, a first groove 15, two cuts or indentations 16, a first sloping portion 171, a projected portion 172 and two thin portions 18.

The first obverse surface 11 faces away from the first reverse surface 12 in the z direction. The semiconductor element is mounted on the first obverse surface 11.

The island portion 13 is in the form of a flat plate without a bend or fold. The island portion 13 is where the semiconductor element 4 is located and thus overlaps with the semiconductor element 4 as seen in the z direction. In the present embodiment, the island portion 13 is substantially rectangular as seen in the z direction. The first reverse surface 12 of the island portion 13 is exposed from the resin package 7. The first reverse surface 12 of the island portion 13 may be used as a mounting terminal for mounting the semiconductor device A1 on a circuit board or the like.

The first groove 15 is recessed in the first obverse surface 11 of the island port ion 13 at a position away from the semiconductor element 4 in the z direction. In the present embodiment, the first groove 15 extends through the island portion 13 in the x direction. As shown in FIGS. 7 and 8, the first groove 15 has a first inner surface 151, a second inner surface 152, a first curved surface 153, a second curved surface 154 and a bottom surface 155. In one example, the depth of the first groove 15 may be 20 to 30 μm, although the depth is not specifically limited. In the present embodiment, the first groove 15 has an x-direction dimension larger than the x-direction dimension of the semiconductor element 4. The first groove 15 is covered by the resin package 7.

The first inner surface 151 is located closer to the semiconductor element 4, whereas the second inner surface 152, opposite to the first inner surface 151, is located farther from the semiconductor element 4. The first inner surface 151 forms a smaller angle α1 with the z direction than the angle α2 formed by the second inner surface 152 with the z direction. The angle α1 may be 0° to 20°, for example. In the present embodiment, the first inner surface 151 is parallel to the z direction and thus the angle α1 is equal to 0°. The angle α2 may be 30° to 60°, for example. In the present embodiment, the angle α2 is 45°.

The first curved surface 153 defines an outward curve between the first inner surface 151 and the first obverse surface 11. The dimensions of the first curved surface 153 are not specifically limited. In the present embodiment, the dimension D3 of the first curved surface 153 in the z direction is larger than the dimension D1 of the first inner surface 151 in the z direction.

The second curved surface 154 defines an outward curve between the second inner surface 152 and the first obverse surface 11. The dimensions of the second curved surface 154 are not specifically limited. In the present embodiment, the dimension D4 of the second curved surface 154 in the z direction is smaller than the dimension D2 of the second inner surface 152 in the z direction. In addition, the dimension D3 is larger than the dimension D4.

The bottom surface 155 is present between the first inner surface 151 and the second inner surface 152. In the present embodiment, the bottom surface 155 is perpendicular to the z direction.

Figure 11:
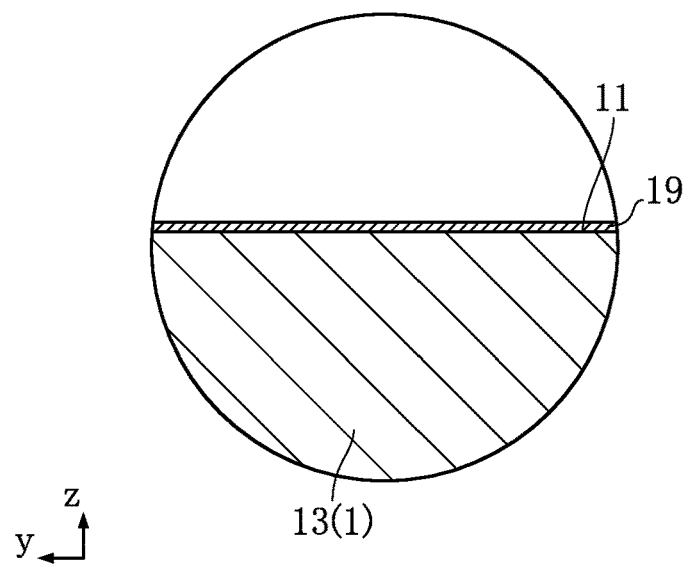
FIG. 11 is an enlarged sectional view showing an exemplary manufacturing step of the semiconductor device shown in FIG. 1.
Figure 12:
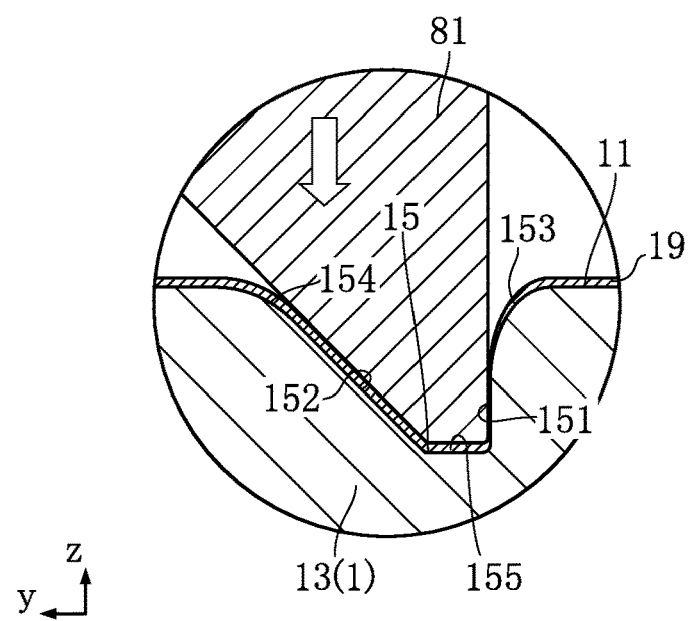
FIG. 12 is an enlarged sectional view showing an exemplary manufacturing step of the semiconductor device shown in FIG. 1.

In the present embodiment, the plating layer 19 is thinner at a portion covering the first inner surface 151 than at a portion covering the second inner surface 152, as shown in FIG. 8. This configuration results from the process of fabricating the first lead 1. FIG. 11 shows a metal material prepared for forming a first lead 1. A plating layer 19 is formed at a portion of the metal material which will be formed into an island portion 13. The thickness of the plating layer 19 at this stage is substantially uniform. As shown in FIG. 12, a metal die 81 having the shape of a wedge is pressed against the metal material to form a first groove 15. At this time, the portion of the metal material deformed into the first inner surface 151 is subjected to strong shear induced by the metal die 81, so that the plating layer 19 is significantly stretched or ruptured. As a result, the plating layer 19 will have the thicknesses variation satisfying the above-noted relation.

As shown in FIGS. 1 to 4 and 6, the island portion 13 has an extension 14 that extends out of the resin package 7. The extension 14 is located opposite the semiconductor element 4 across the first groove 15, as seen in the z direction.

The indentations 16 are formed in the island portion 13 and continuous with the respective ends of the first groove 15, as seen in the z direction. In the present embodiment, the indentations 16 are spaced from each other in the x direction and recessed in the y direction. The shape of the indentations 16 is not specifically limited. In the present embodiment, the indentations 16 are rectangular, as seen in the z direction. The indentations 16 are covered by the resin package 7.

The first sloping portion 171 and the projected portion 172 are located opposite to the extension 14 with respect to the semiconductor element 4. As seen in the z direction, the first sloping portion 171 and the projected portion 172 are aligned, and their combination provides a strip shape elongated in the y direction. The projected portion 172 extends out of the resin package 7 in the y direction. The first sloping portion 171 connects the projected portion 172 to the island portion 13. As illustrated in FIG. 4, the first sloping portion 171 extends upwards from the island portion 13. Therefore, the projected portion 172 is located above the island portion 13 in the z direction (the direction in which the first obverse surface 11 is facing).

As seen from FIG. 3, the island portion 13 has two straight side edges spaced apart in the x direction and disposed close to the semiconductor element 4 in a manner flanking the semiconductor element 4. Each of these side edges has a first end adjacent to one of the indentations 16 and extends away from the first end to the opposite end or second end, along the y direction (hence referred to as a "lengthwise edge"). The island portion 13 further has another straight edge ("widthwise edge") extending in the x direction to connect the above second ends of the respective lengthwise edges. In FIG. 3, the widthwise edge of the island portion 13 is parallel to the first groove 15 and disposed opposite to the first groove 15 with respect to the semiconductor element 4.

Each thin portion 18 is formed to extend along the corresponding one of the lengthwise edges and a part of the widthwise edge. The thin portions 18 have a thickness (size measured in the z direction) that is less than the distance between the first obverse surface 11 and the first reverse surface 12. As seen from FIG. 6, for example, the thin portions 18 are located above the first reverse surface 12 in the z direction. The lower side of the thin portions 18 is covered by the resin package 7.

The second lead 2 and the third lead 3 are spaced apart from the first lead 1. In the present embodiment, the second lead 2 and the third lead 3 are located on the same side of the island portion 13 in the y direction. The first sloping portion 171 and the projected portion 172 are located between the second lead 2 and the third lead 3 in the x direction.

The second lead 2 has a second obverse surface 21, a second reverse surface 22, a second wire-bonding pad 23, a second terminal portion 24 and a second sloping portion 25.

The second obverse surface 21 faces in the same direction as the first obverse surface 11 of the first lead 1. The second reverse surface 22 faces in the same direction as the first reverse surface 12 of the first lead 1. The second wire-bonding pad 23 is rectangular as seen in the z direction and one end of the wire 61 is bonded thereto. In the present embodiment, the entire second wire-bonding pad 23 is enclosed in the resin package 7 and located above the island portion 13 in the z direction.

The second terminal portion 24 extends out of the resin package 7 at the side opposite to the extension 14 in the y direction. The second terminal portion 24 may be used to mount the semiconductor device A1 to a circuit board or the like. The second terminal portion 24 is located at the substantially same height as the island portion 13 in the z direction. The second sloping portion 25 connects the second wire-bonding pad 23 to the second terminal portion 24. The second sloping portion 25 is bent as seen in the x direction.

The second lead 2 may be provided with a second groove 26. In the present embodiment, the second groove 26 is provided between the portion to which the wire 61 is bonded and the second terminal portion 24, as shown in FIG. 1.

The third lead 3 has a third obverse surface 31, a third reverse surface 32, a third wire-bonding pad 33, a third terminal portion 34 and a third sloping portion 35.

The third obverse surface 31 faces in the same direction as the first obverse surface 11 of the first lead 1. The third reverse surface 32 faces in the same direction as the first reverse surface 12 of the first lead 1. The third wire-bonding pad 33 is rectangular as seen in the z direction and one end of the wire 62 is bonded thereto. In the present embodiment, the entire third wire-bonding pad 33 is enclosed in the resin package 7 and located above the island portion 13 in the z direction.

The third terminal portion 34 extends out of the resin package 7 at the side opposite to the extension 14 in the y direction. The third terminal portion 34 may be used to mount the semiconductor device A1 to a circuit board or the like. The third terminal portion 34 is located at the substantially same height as the island portion 13 in the z direction. The third sloping portion 35 connects the third wire-bonding pad 33 to the third terminal portion 34. The third sloping portion 35 is bent as seen in the x direction.

The third lead 3 may be provided with a third groove 36. In the present embodiment, the third groove 36 is provided between the portion to which the wire 62 is bonded and the third terminal portion 34, as shown in FIG. 1.

Examples of the semiconductor element 4 include diodes and transistors. In the present embodiment, the semiconductor element 4 is a transistor. The semiconductor element 4 is rectangular as seen in the z direction and has four sides, two extending in the x direction and two extending in the y direction. One of the sides of the semiconductor element 4 is close and parallel to the first groove 15.

The semiconductor element 4 has obverse-surface electrodes 41 and 42 and a reverse-surface electrode 43. The obverse-surface electrodes 41 and 42 are disposed on the surface of the semiconductor element 4 that faces in the same direction as the first obverse surface 11. The reverse-surface electrode 43 is disposed on the surface of the semiconductor element 4 that faces in the same direction as the first reverse surface 12. In the present embodiment, the electrodes 41, 42 and 43 are respectively a gate electrode, a source electrode and a drain electrode.

The bonding member 5 fixes the semiconductor element 4 to the first obverse surface 11 of the island portion 13. In the present embodiment, the bonding member 5 is made of solder and electrically conductive, though its configuration is not limited to the illustrated one.

The wire 61 connects the obverse-surface electrode 41 of the semiconductor element 4 to the second wire-bonding pad 23 of the second lead 2. In the present embodiment, the wire 61 is made of A1, for example.

The wire 62 connects the obverse-surface electrode 42 of the semiconductor element 4 to the third wire-bonding pad 33 of the third lead 3. In the present embodiment, the wire is made of A1, for example.

The resin package 7 encloses a portion of the first lead 1, a portion of the second lead 2, a portion of the third lead 3, the semiconductor element 4, the bonding member 5 and the wires 61 and 62. The resin package 7 may be made of a black epoxy resin, for example. In the present embodiment, the resin package 7 is rectangular as seen in the z direction.

The following now describes advantages of the semiconductor device A1.

In the present embodiment, the first groove 15 is provided in the first obverse surface 11. The first groove 15 is so configured that the angle $\alpha 1$ of the first inner surface 151 (which is closer to the semiconductor element 4) relative to the x direction is smaller than the angle $\alpha 2$ of the second inner surface 152 (which is father from the semiconductor element 4) relative to the x direction. In the manufacturing process of the semiconductor device A1, a fluid bonding material to form the bonding member 5 is applied between the semiconductor element 4 and the first obverse surface 11. If the amount of the applied material is greater than a certain limit, however, the bonding material may spread over a large area and reach the first groove 15. Advantageously, the first groove 15 is configured so that the contact angle between the first inner surface 151 and the fluid bonding material is sufficiently large. Thus, the bonding material can be prevented from spreading further beyond the first groove 15.

In the present embodiment, the first inner surface 151 is parallel to the z direction, meaning that the angle $\alpha 1$ is equal to 0 degrees. This configuration is preferable for preventing the fluid material (such as molten solder) from overspreading.

The first groove 15 extends through the island portion 13 in the x direction. This configuration effectively prevents the applied bonding material (hence the resulting bonding member 5) from going beyond the first groove 15 toward the extension 14. In addition, the first groove 15 is terminated, at its both ends, with the indentations 16. By the two indentations 16, the x-direction dimension of the island portion 13 is locally smaller than the rest of the island portion 13. This configuration is also effective to restrict the spreading of the material of the bonding member 5. Note that the x-direction dimension of the first groove 15 is larger than the x-direction dimension of the semiconductor element 4. This enables the first groove 15 to stop the overflowing of the bonding material even if the material has spread as wide as the x-direction dimension of the semiconductor element 4.

As viewed in the z direction, the first groove 15 is parallel to an edge of the semiconductor element 4. This configuration enables the first groove 15 to more reliably stop the fluid bonding material squeezed out by the semiconductor element 4.

The island portion 13 of the first lead 1 is provided with the thin portions 18, which are effective to prevent the first lead 1 from being pulled out of the resin package 7. Preventing detachment of the first lead 1 is preferable especially in the present embodiment where the first reverse surface 12 of the island portion 13 is exposed from the resin package 7.

Figure 13:
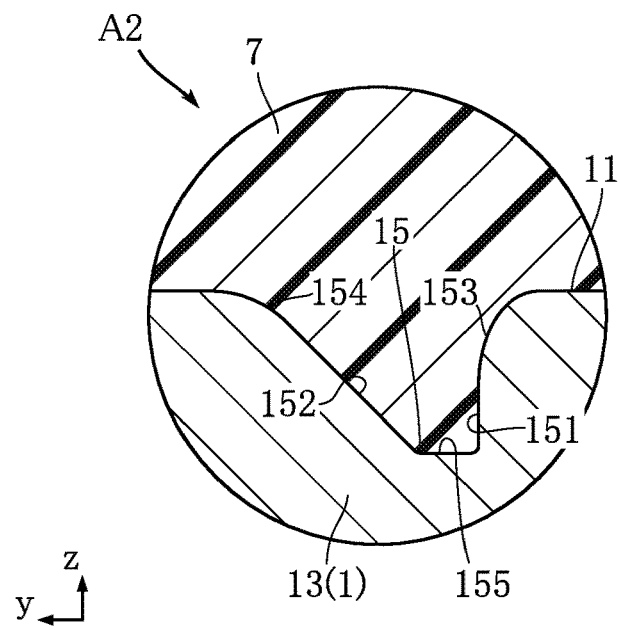
FIG. 13 is an enlarged sectional view of a semiconductor device according to a second embodiment of the present disclosure.
Figure 14:
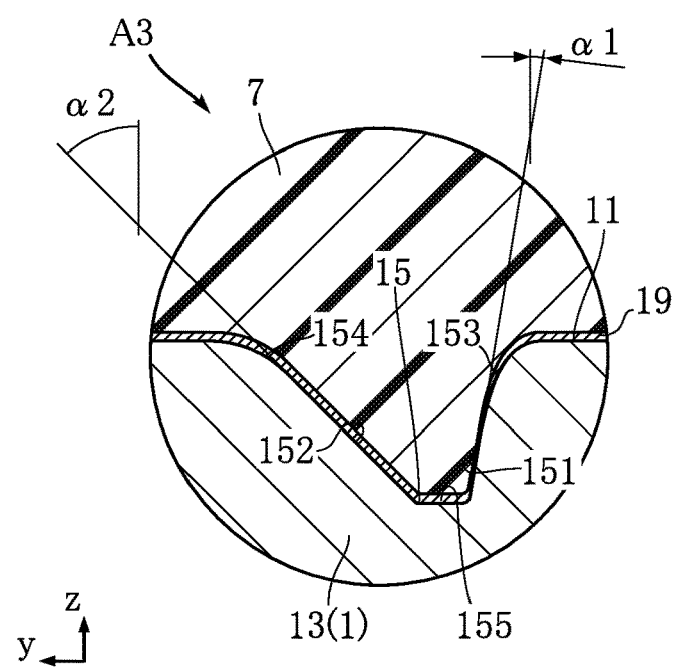
FIG. 14 is an enlarged sectional view of a semiconductor device according to a third embodiment of the present disclosure.
Figure 15:
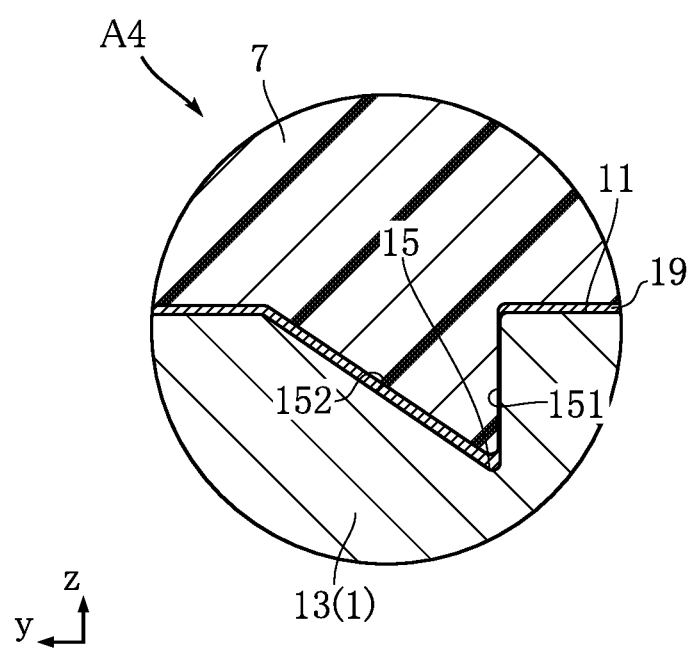
FIG. 15 is an enlarged sectional view of a semiconductor device according to a fourth embodiment of the present disclosure.

FIGS. 13 to 15 show other embodiments of the present disclosure. In the figures, the elements identical or similar to those of the foregoing embodiment are designated by the same reference signs as those used for the foregoing embodiment.

FIG. 13 shows a semiconductor device according to a second embodiment of the present disclosure. The semiconductor device A2 of the present embodiment differs from the first embodiment in the configuration of the first lead 1.

In the present embodiment, the first lead 1 is without a plating layer 19, which is included in the semiconductor device A1. In addition, the second lead 2 and the third lead 3 are also without a plating layer like the plating layer 19. In the present embodiment, the first lead 1 is provided with the first groove 15. The first groove 15 has a first inner surface 151, a second inner surface 152, a first curved surface 153, a second curved surface 154 and a bottom surface 155, each of which is similar to those of the semiconductor device A1.

This embodiment can restrict the undesired flow of the material applied to form the bonding member 5. That is, by providing the first groove 15, the material of the bonding member 5 is dully confined without a plating layer 19. The plating layer 19 may be omitted also in other embodiments described below.

FIG. 14 shows a semiconductor device according to a third embodiment of the present disclosure. The semiconductor device A3 of the present embodiment differs from the first embodiment in the configuration of the first groove 15. In the present embodiment, the first inner surface 151 is not parallel to the z direction and thus the angle α1 is not equal to 0 degrees. The angle α1 may be approximately 10 degrees, for example. The present embodiment still holds that the angle α1 is smaller than the angle α2. The present embodiment also holds that the plating layer 19 is thinner at a portion covering the first inner surface 151 than at a portion covering the second inner surface 152.

FIG. 15 shows a semiconductor device according to a fourth embodiment of the present disclosure. The semiconductor device A4 of the present embodiment differs from the first embodiment in the configuration of the first groove 15. In the present embodiment, the first groove 15 has a first inner surface 151 and a second inner surface 152 but may not have a first curved surface 153, second curved surface 154 or bottom surface 155. The present embodiment is similar to the first embodiment in that angle α1 of the first inner surface 151 with the z direction is smaller than the angle α2 of the second inner surface 152 with the z direction. The present embodiment also holds that the plating layer 19 is thinner at a portion covering the first inner surface 151 than at a portion covering the second inner surface 152.

The semiconductor devices according to the present disclosure are not limited to those in the embodiments described above. The specific configuration of each part of the semiconductor device of the present disclosure may be varied in many ways.

The invention claimed is:

1. A semiconductor device comprising:
   a semiconductor element;
   a first lead having a first obverse surface on which the semiconductor element is mounted and a first reverse surface opposite to the first obverse surface;
   a bonding member that bonds the semiconductor element to the first obverse surface; and
   a resin package that encloses the semiconductor element and at least a portion of the first lead,
   wherein the first lead is formed with a first groove recessed in the first obverse surface at a location spaced apart from the semiconductor element as viewed in a thickness direction of the semiconductor element, the first groove having a first inner surface and a second inner surface opposite to the first inner surface, the first inner surface being closer to the semiconductor element than is the second inner surface, and
   an angle the first inner surface forms with respect to the thickness direction is smaller than an angle the second inner surface forms with respect to the thickness direction.

2. The semiconductor device according to claim 1, wherein the first inner surface is parallel to the thickness direction.

3. The semiconductor device according to claim 1, wherein the first lead has a first curved surface between the first inner surface and the first obverse surface.

4. The semiconductor device according to claim 3, wherein the first curved surface has a larger dimension in the thickness direction than a dimension of the first inner surface in the thickness direction.

5. The semiconductor device according to claim 3, wherein the first lead has a second curved surface between the second inner surface and the first obverse surface.

6. The semiconductor device according to claim 5, wherein the first curved surface has a larger dimension in the thickness direction than a dimension of the second curved surface in the thickness direction.

7. The semiconductor device according to claim 5, wherein the first lead has a bottom surface between the first inner surface and the second inner surface.

8. The semiconductor device according to claim 7, wherein the bottom surface is perpendicular to the thickness direction.

9. The semiconductor device according to claim 5, wherein the first lead is formed with a plating layer covering the first obverse surface and the first groove.

10. The semiconductor device according to claim 9, wherein the plating layer has a first portion and a second portion that cover the first inner surface and the second inner surface, respectively, and the first portion is thinner than the second portion.

11. The semiconductor device according to claim 1, wherein the first lead has a pair of indentations formed at opposite ends of the first groove.

12. The semiconductor device according to claim 11, wherein the indentations are covered by the resin package.

13. The semiconductor device according to claim 1, wherein the bonding member is electrically conductive.

14. The semiconductor device according to claim 13, wherein the bonding member is made of solder.

15. The semiconductor device according to claim 1, wherein the semiconductor element is rectangular as viewed in the thickness direction, and
the first groove extends in parallel to an edge of the semiconductor element.

16. The semiconductor device according to claim 15, wherein the first groove is covered by the resin package.

17. The semiconductor device according to claim 1, wherein the first lead includes an island portion.

18. The semiconductor device according to claim 17, wherein the first groove is provided in the island portion.

19. The semiconductor device according to claim 18, wherein the island portion has a reverse surface exposed from the resin package.

20. The semiconductor device according to claim 19, wherein the island portion has an extension that extends out of the resin package, and the extension is located opposite to the semiconductor element with respect to the first groove.

21. The semiconductor device according to claim 20, wherein the semiconductor element is provided with a reverse-surface electrode.

22. The semiconductor device according to claim 21, wherein the semiconductor element is a transistor, and the reverse-surface electrode is a drain electrode.

23. The semiconductor device according to claim 22, further comprising a second lead and a second wire,
wherein the semiconductor element is provided with a first obverse-surface electrode and a second obverse-surface electrode,
the second lead has a second terminal portion extending out of the resin package opposite to the extension; and
the second wire connects the first obverse-surface electrode to the second lead.

24. The semiconductor device according to claim 23, wherein the first obverse-surface electrode is a gate electrode.

25. The semiconductor device according to claim 24, wherein the second lead is formed with a second groove between the second wire and the second terminal portion.

26. The semiconductor device according to claim 24, further comprising a third lead and a third wire,
the third lead has a third terminal portion extending out of the resin package opposite to the extension; and
the third wire connects the second obverse-surface electrode to the third lead.

27. The semiconductor device according to claim 26, wherein the second obverse-surface electrode is a source electrode.

28. The semiconductor device according to claim 27, wherein the third lead is formed with a third groove between the third wire and the third terminal portion.

* * * * *